(12) United States Patent
Shin

(10) Patent No.: US 7,838,385 B2
(45) Date of Patent: Nov. 23, 2010

(54) METHOD FOR MANUFACTURING RESERVOIR CAPACITOR OF SEMICONDUCTOR DEVICE

(75) Inventor: Won Ho Shin, Seoul (KR)

(73) Assignee: Hynix Semiconductor Inc, Icheon-Si (KR)

( * ) Notice: Subject to any disclaimer, the term of this patent is extended or adjusted under 35 U.S.C. 154(b) by 24 days.

(21) Appl. No.: 12/488,579

(22) Filed: Jun. 21, 2009

(65) Prior Publication Data

US 2010/0159668 A1 Jun. 24, 2010

(30) Foreign Application Priority Data

Dec. 24, 2008 (KR) ........................ 10-2008-0133285

(51) Int. Cl.
*H01L 21/20* (2006.01)

(52) U.S. Cl. .................. 438/397; 438/253; 438/155; 438/197; 257/288; 257/295; 257/298; 257/E21.009; 257/E21.664

(58) Field of Classification Search ............. 438/197, 438/155, 253, 397; 257/288, 295, 298, 627, 257/E21.009, E21.664
See application file for complete search history.

(56) References Cited

U.S. PATENT DOCUMENTS

| | | | | |
|---|---|---|---|---|
| 7,446,361 B2 * | 11/2008 | Maruyama | ................. | 257/295 |
| 2006/0249768 A1 * | 11/2006 | Izumi | ......................... | 257/295 |
| 2007/0122970 A1 * | 5/2007 | Kim et al. | ................... | 438/253 |

* cited by examiner

*Primary Examiner*—Jarrett J Stark
*Assistant Examiner*—Wilner Jean Baptiste

(57) ABSTRACT

A method for manufacturing a reservoir capacitor of a semiconductor device reduces the resistance of the reservoir capacitor to secure reliability of the semiconductor device. The method comprises: forming a dummy pattern having a lattice structure over a transistor; forming a first interlayer insulating film over the resulting structure including the dummy pattern; etching the first interlayer insulating film to form a line-structured storage node contact region between the lattice structures; and filling a conductive layer in the line-structured storage node contact region to form a line-structured storage node contact.

7 Claims, 5 Drawing Sheets

METHOD FOR MANUFACTURING RESERVOIR CAPACITOR OF SEMICONDUCTOR DEVICE

CROSS-REFERENCE TO RELATED APPLICATION

The priority of Korean patent application No. 10-2008-0133285 filed Dec. 24, 2008, the disclosure of which is hereby incorporated in its entirety by reference, is claimed.

BACKGROUND OF THE INVENTION

The present invention relates to a method for manufacturing a reservoir capacitor of a semiconductor device.

A semiconductor memory device configured to store data such as program commands includes a Dynamic Random Access Memory (DRAM) and a Static Random Access Memory (SRAM). The DRAM, which enables reading and writing of information, requires a periodic refresh of the stored information or the data will be lost. The DRAM has been widely used as a large-capacity memory in spite of the required refresh operation because of its inexpensive cost per memory cell and improved integration.

Generally, a memory device, that is, a memory cell includes a transistor and a capacitor. The capacitor has a structure where a dielectric material is located between two electrodes. The capacitance of the capacitor is proportional to an electrode surface area and a dielectric constant of a dielectric film, and inversely proportional to a distance between electrodes, that is, the thickness of the dielectric film.

In order to manufacture a capacitor of high capacitance, several methods have been suggested. This includes a method of using a dielectric film having a large dielectric constant, a method of reducing a thickness of a dielectric film, a method of enlarging a surface of a lower electrode, and a method of reducing a distance between electrodes.

However, as the device size of semiconductor memory becomes smaller due to increased integration, it becomes difficult to manufacture a capacitor that can secure sufficient capacitance due to a reduction of the surface area of the electrodes. Also, there is a limit in increasing the dielectric constant without increasing the electrode surface area of the capacitor in order to improve the capacitance of the capacitor. As a result, a concave-type or a cylinder-type capacitor having a three-dimensional structure is developed to increase the electrode surface area without increasing the capacitor foot print.

Several power sources for operating a semiconductor device are required in other regions including a peri region as well as a capacitor of a cell region. When the power sources are supplied, noise is inevitably generated. In order to remove the noise, a reservoir capacitor has been used. The reservoir capacitor is simultaneously formed in other regions including the peri region when the transistor of the cell region is formed. It is preferable to form multiple reservoir capacitors in several regions in the semiconductor device if possible. Generally, the reservoir capacitor uses a MOS capacitor including a gate, a source and a drain.

FIG. 1 is a plane diagram illustrating a conventional method for manufacturing a reservoir capacitor of a semiconductor device.

Referring to FIG. 1, a gate 125 is formed over a semiconductor substrate 100, and an interlayer insulating film (not shown) is formed over the gate 125. After the interlayer insulating film is etched, a conductive material is filled to form a line-structured storage node contact 140. As a result of increasing integration of the semiconductor device, the width of the storage node contact 140 is made continuously smaller. In order to obtain the storage node contact 140, the interlayer insulating film is etched, the conductive material is filled, and an etch-back process is performed on the conductive material. During the process, a portion of the line-structured storage node contact having a narrow width can be disconnected.

FIG. 2 is a cross-sectional diagram illustrating a conventional method for manufacturing a reservoir capacitor of a semiconductor device. FIG. 2 shows a cross-sectional view taken along A-A'.

Referring to FIG. 2, a gate oxide film (not shown), a gate metal layer 110 and a gate hard mask layer 120 are formed over a semiconductor substrate 100, thereby obtaining a gate 125. A first interlayer insulating film 130 is formed over the resulting structure including the gate 125. A photoresist film (not shown) is formed over the first interlayer insulating film 130. An exposing and developing process is performed with a line-structured mask to obtain a photoresist pattern (not shown). The first interlayer insulating film 130 is etched with the photoresist pattern as a mask to obtain a line-structured storage node contact region (not shown). However, when the first interlayer insulating film 130 is etched to form a line-structured storage node contact region, the first interlayer insulating film 130 can be over-etched, thereby etching the lower gate metal layer 110 and create a short circuit (see region "X" of FIG. 2).

After a conductive layer is filled in the line-structured storage node contact region, the conductive layer is etched back to form a line-structured storage node contact 140. When the conductive layer is etched back, a portion of the line-structured storage node contact 140 can be separated, or a gap can be created. (see region "Y" of FIG. 2).

Subsequently, a second interlayer insulating film 150 is formed over the resulting structure including the line-structured storage node contact 140. After a photoresist film is formed over the second interlayer insulating film 150, an exposing and developing process is performed with a hole-structured mask to obtain a photoresist pattern (not shown). The second interlayer insulating film 150 is etched with the photoresist pattern as a mask to form a hole-structured storage node contact region (not shown) over the line-structured storage node contact 140. After a conductive layer is filled in the hole-structured storage node contact region, the conductive layer is etched back to form a hole-structured storage node contact 160.

A lower electrode 170, a dielectric film (not shown) and an upper electrode 180 are formed over the hole-structured storage node contact 160, thereby obtaining a reservoir capacitor.

FIG. 3 is a circuit diagram illustrating a conventional method for manufacturing a reservoir capacitor of a semiconductor device.

Referring to FIG. 3, a region A of FIG. 3 shows when a portion of the line-structured storage node contact 140 is disconnected, and a region B of FIG. 3 shows when the lower gate 125 contacts with the line-structured storage node contact 140 to generate a short.

In FIG. 3, after a gate is formed over a semiconductor substrate, an interlayer insulating film is deposited for forming a line-structured storage node contact. During this process, the interlayer insulating film can be over-etched so that a lower gate metal layer is exposed. In this case, an electric short is generated between the contact and the gate metal layer. Also in FIG. 3, after a conductive layer is filled in the line-structured storage node contact region, the conductive layer is etched back to form a line-structured storage node contact. However, when the line-structured storage node contact is not formed to have a sufficient depth, a portion of the line-structured storage node contact can be separated by the etch-back process.

BRIEF SUMMARY OF THE INVENTION

Various embodiments of the invention relate to a method for manufacturing a reservoir capacitor of a semiconductor device that reduces the resistance of the reservoir capacitor to secure reliability of the semiconductor device.

According to an embodiment of the present invention, a method for manufacturing a reservoir capacitor of a semiconductor device comprises: forming a dummy pattern having a lattice structure over a transistor; forming a first interlayer insulating film over the resulting structure including the dummy pattern; etching the first interlayer insulating film to form a line-structured storage node contact region between the lattice structures; and filling a conductive layer in the line-structured storage node contact region to form a line-structured storage node contact.

Preferably, the method further comprises: forming a second interlayer insulating film over the resulting structure including the line-structured storage node contact; and etching the second interlayer insulating film to form a hole-structured storage node contact over the line-structured storage node contact.

Preferably, the width of the lattice is formed to be the same as that of a bit line formed in a cell region or to be thicker than that of the bit line.

Preferably, the forming-a-hole-structured-storage-node-contact includes: etching the second interlayer insulating film to form a hole-structured storage node contact region; and filling a conductive layer in the hole-structured storage node contact region and performing an etch-back process on the conductive layer.

Preferably, the dummy pattern includes a metal layer.

Preferably, the line-structured storage node contact is connected to the lattice-structured dummy pattern.

DESCRIPTION OF EMBODIMENTS

Figure 1:
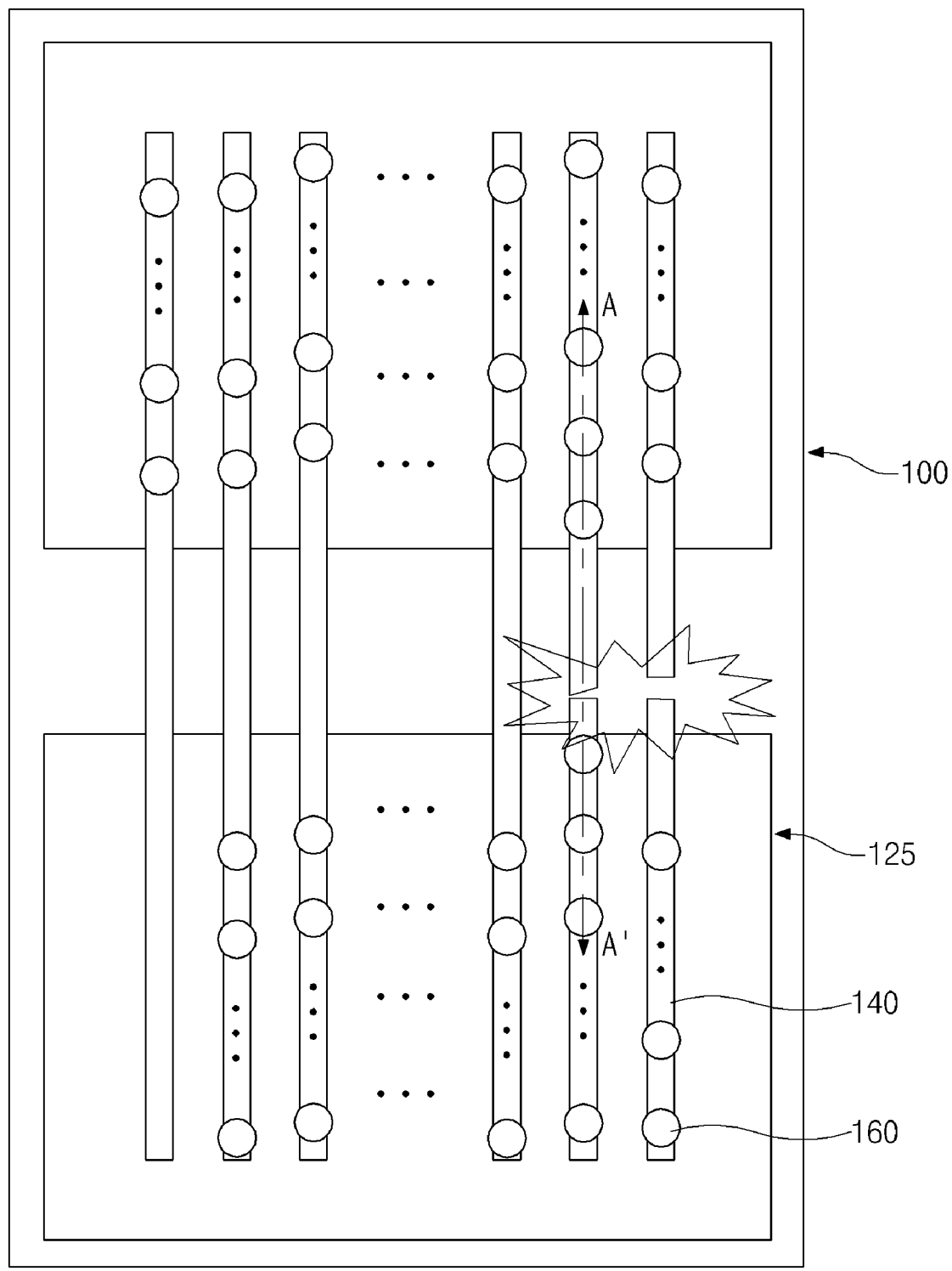
FIG. 1 is a plane diagram illustrating a conventional method for manufacturing a reservoir capacitor of a semiconductor device.
Figure 2:
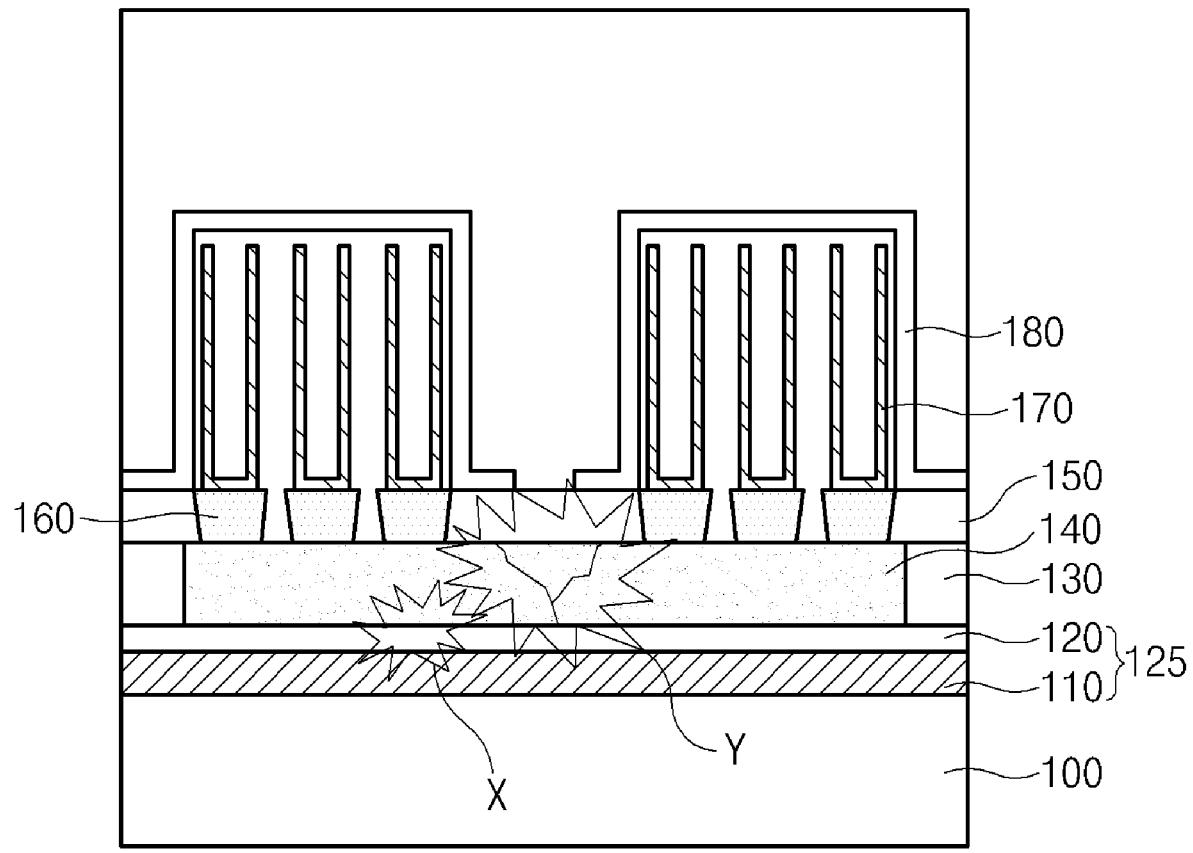
FIG. 2 is a cross-sectional diagram illustrating a conventional method for manufacturing a reservoir capacitor of a semiconductor device.
Figure 3:
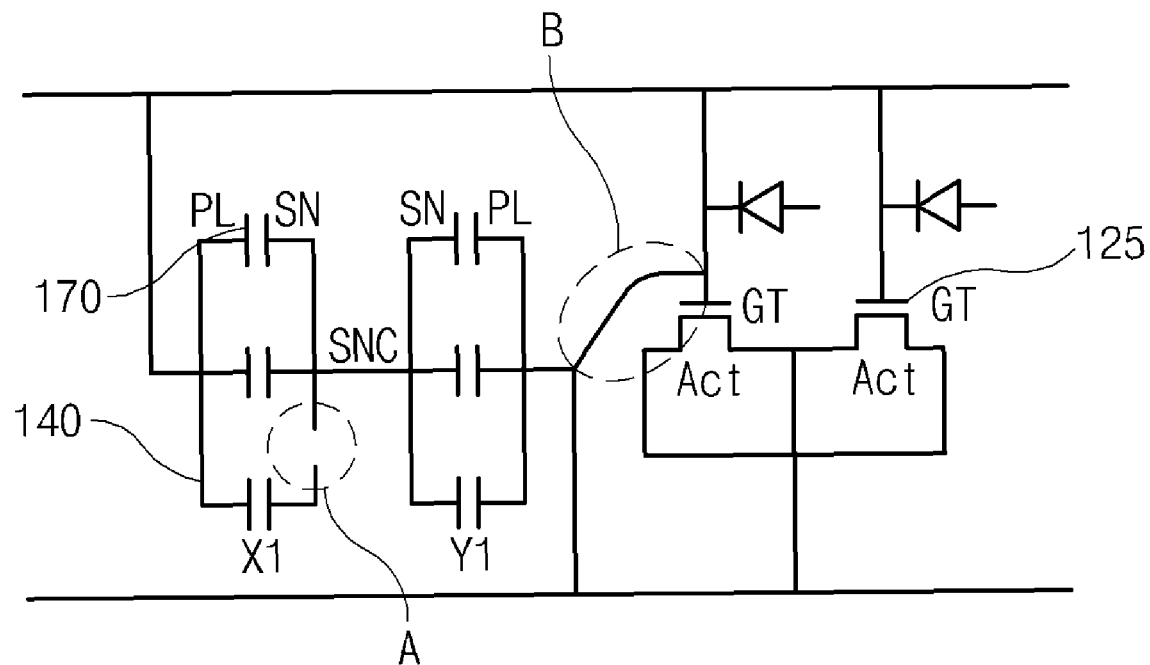
FIG. 3 is a circuit diagram illustrating a conventional method for manufacturing a reservoir capacitor of a semiconductor device.
Figure 4:
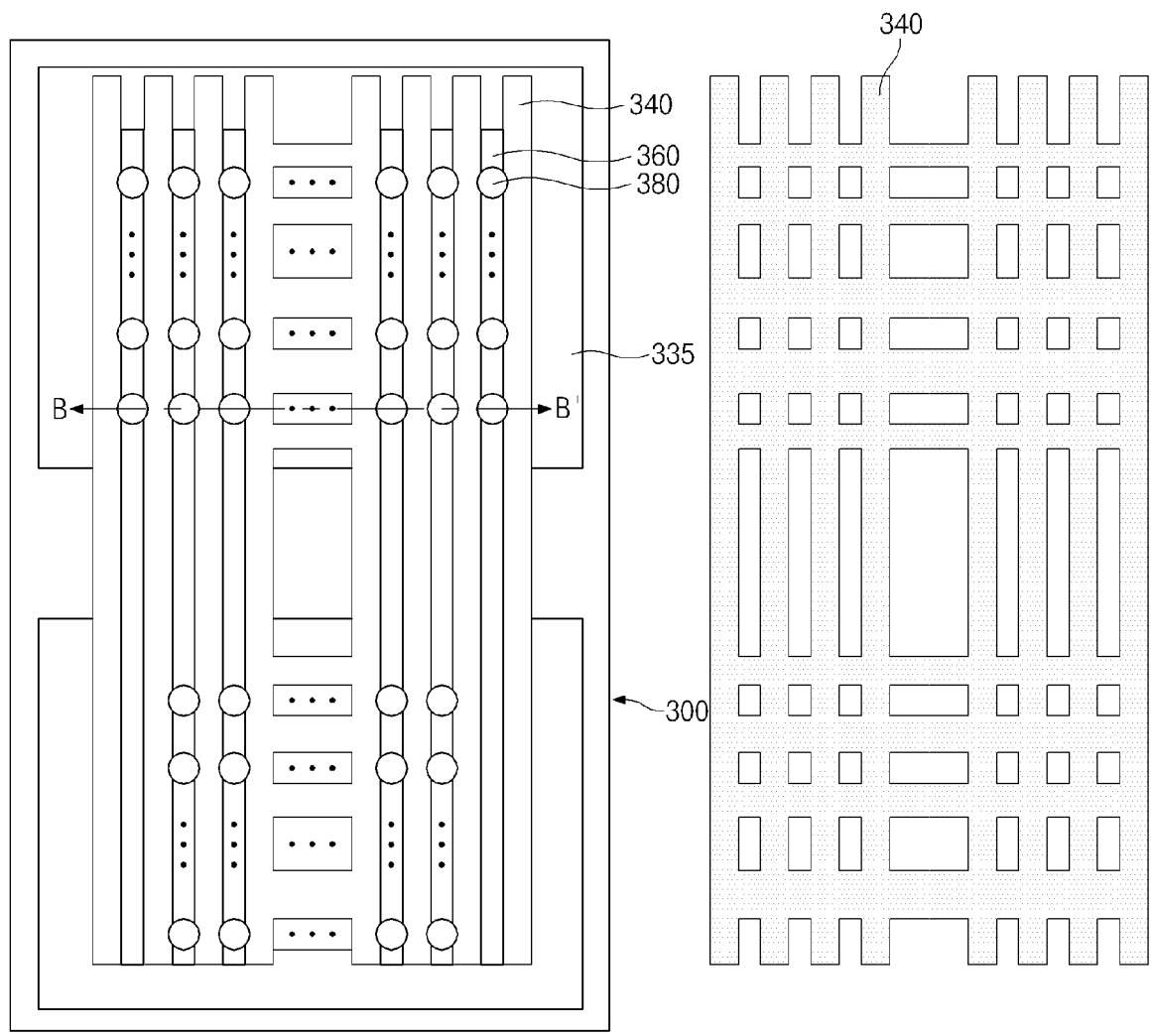
FIG. 4 is a plane diagram illustrating a method for manufacturing a reservoir capacitor of a semiconductor device according to an embodiment of the present invention.

FIG. 4 is a plane diagram illustrating a method for manufacturing a reservoir capacitor of a semiconductor device according to an embodiment of the present invention.

Referring to FIG. 4, a gate (transistor) 335 is formed over a semiconductor substrate 300. A lattice-structured dummy pattern 340 is formed over the resulting structure including the gate 335. The dummy pattern 340 has a width formed to be substantially the same or greater than a bit line of a cell region (not shown) A line-type storage node contact 360 is formed over the lattice-structured dummy pattern 340. The storage node contact 360 is disposed between the lattices of the dummy pattern 340. A hole-type storage node contact 380 is formed over the line-type storage node contact 360.

Figure 5:
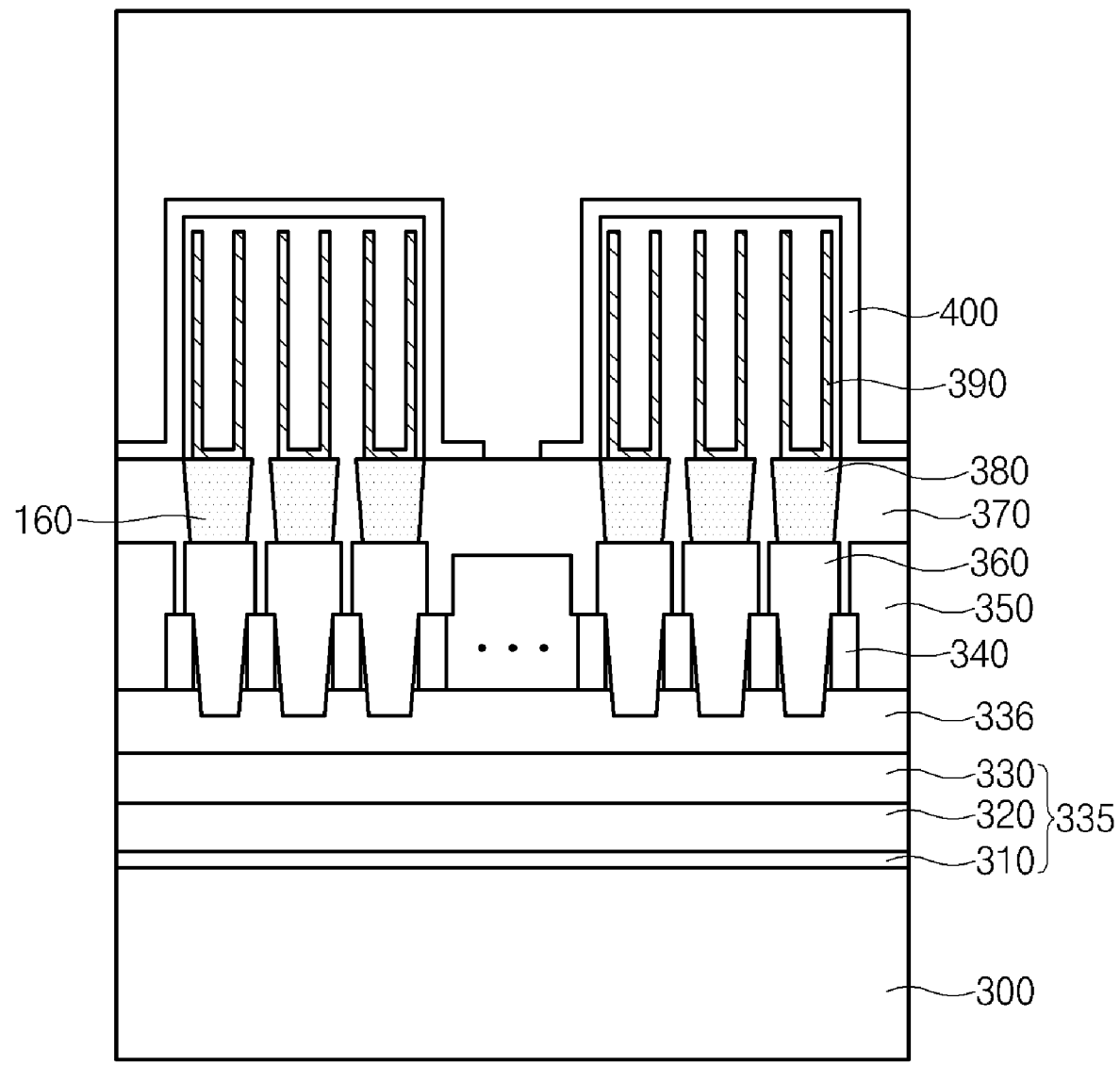
FIG. 5 is a cross-sectional diagram illustrating a method for manufacturing a reservoir capacitor of a semiconductor device according to an embodiment of the present invention.

FIG. 5 is a cross-sectional diagram illustrating a method for manufacturing a reservoir capacitor of a semiconductor device according to an embodiment of the present invention. FIG. 5 shows a cross-sectional view taken along B-B' in FIG. 4, which is an orthogonal direction to that of the cross-sectional view of A-A'.

Referring to FIG. 5, the gate 335 including a gate oxide film 310, a gate electrode layer 320 and a gate hard mask layer 330 is formed over the semiconductor substrate 300.

An insulating film 336 is formed over the resulting structure including the gate 335, and a metal layer (not shown) is formed over the insulating film 336. A photoresist film is formed over the metal layer. An exposing and developing process is performed with a lattice-structured dummy pattern mask to form a photoresist pattern (not shown). The metal layer is etched with the photoresist pattern as an etching mask to form a lattice-structured dummy pattern 340 The width of the lattice of the dummy pattern 340 is formed to be the same as that of the bit line of the cell region or thicker than that of the bit line.

A first interlayer insulating film 350 is formed over the resulting structure including the lattice-structured dummy pattern 340. A photoresist film is formed over the first interlayer insulating film 350. An exposing and developing process is performed with a line-structured mask to form a photoresist pattern (not shown). The first interlayer insulating film 350 is etched with the photoresist pattern as an etching mask to form a line-structured storage node contact region (not shown).

A conductive material (or conductive layer) is filled in the line-structured storage node contact region. An etch-back process is performed on the conductive material to form a line-structured storage node contact 360. The line-structured storage node contact 360, which is placed between the lattice-structured dummy patterns 340, has a depth which does not make contact with the gate 335. When the line-structured storage node contact 360 is formed, a self-alignment process is performed with the lattice-structured dummy pattern 340 as a barrier film to improve a process margin. A connected shape of the line-structure storage node contact 360 and the lattice-structured dummy pattern 340 reduces effective series resistance of a MOS-type transistor, thereby improving capacitance of the MOS-type transistor.

A second interlayer insulating film 370 is formed over the resulting structure including the line-structured storage node contact 360. A photoresist film is formed over the second interlayer insulating film 370. An exposing and developing process is performed with a hole-structured mask to form a photoresist pattern (not shown). The second interlayer insulating film 370 is etched with the photoresist pattern as a mask to form a hole-structured storage node contact region (not shown) over the line-structured storage contact 360. After a conductive material is filled in the hole-structured storage node contact region, the conductive material is etched back to form a hole-structured storage node contact 380.

A lower electrode 390, a dielectric film (not shown) and an upper electrode 400 are formed over the hole-structured storage node contact 380, thereby obtaining a general cylinder-type capacitor. A uF (Micro Farrat) reservoir capacitor is formed to include a lower transistor and a cylinder-type capacitor.

As described above, the present invention provides a method for manufacturing a reservoir capacitor of a semiconductor device that comprises: forming a lattice-structured dummy pattern over a transistor; forming a first interlayer insulating film over the resulting structure including the dummy pattern; etching the first interlayer insulating film to form a line-structured storage node contact region between the lattice structures; and filling a conductive layer in the line-structured storage node contact region to form a line-structured storage node contact. While a reservoir capacitor is formed, a lattice-structured dummy pattern is formed over a transistor, and a line-structured storage node contact (SNC) is formed over the lattice-structured dummy pattern, thereby reducing effective series resistance of a transistor to improve capacitance of the transistor.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a reservoir capacitor of a semiconductor device, the method comprising:
    forming a lattice-structured dummy pattern over a transistor;
    forming a first interlayer insulating film over the dummy pattern;
    etching the first interlayer insulating film between the lattice structures to form a line-structured storage node contact region; and
    filling conductive material into the line-structured storage node contact region to form a line-structured storage node contact.

2. The method according to claim 1, further comprising:
    forming a second interlayer insulating film over the line-structured storage node contact; and
    etching the second interlayer insulating film to form a hole-structured storage node contact which is electrically connected to the line-structured storage node contact.

3. The method according to claim 2, wherein the forming-a-hole-structured-storage-node-contact includes:
    etching the second interlayer insulating film so as to expose the line-structured storage node contact;
    filling the conductive material into the hole-structured storage node contact region; and
    performing an etch-back process on the conductive material to form the hole structured storage node contact region.

4. The method according to claim 1, wherein the width of the lattice is formed to be substantially the same as or wider than that of a bit line formed in a cell region.

5. The method according to claim 1, wherein the dummy pattern includes a metal layer.

6. The method according to claim 1, wherein the line-structured storage node contact is connected to the lattice-structured dummy pattern.

7. The method according to claim 1, the dummy pattern is formed spaced apart from the transistor by a given distance, so that the dummy pattern and the transistor are not in contact.

* * * * *